United States Patent [19]
Greim

[11] Patent Number: 6,114,854
[45] Date of Patent: Sep. 5, 2000

[54] ANTENNA FOR A MAGNETIC RESONANCE DEVICE

[75] Inventor: Helmut Greim, Adelsdorf, Germany

[73] Assignee: Siemens Aktiengesellschaft, Munich, Germany

[21] Appl. No.: 09/084,188

[22] Filed: May 26, 1998

[30] Foreign Application Priority Data

May 26, 1997 [DE] Germany .............. 197 21 983

[51] Int. Cl.[7] ........................................ G01V 3/00
[52] U.S. Cl. ........................................... 324/318
[58] Field of Search ................... 324/318, 322, 324/300, 312, 314, 307, 309; 600/422

[56] References Cited

U.S. PATENT DOCUMENTS

| | | | |
|---|---|---|---|
| 4,757,290 | 7/1988 | Keren ........................... | 324/318 |
| 4,812,761 | 3/1989 | Vaughan, Jr. ................ | 324/307 |
| 4,825,163 | 4/1989 | Yabusaki et al. ............ | 324/318 |
| 5,382,903 | 1/1995 | Young ........................... | 324/318 |
| 5,435,302 | 7/1995 | Lenkinski et al. ........... | 324/318 |
| 5,473,251 | 12/1995 | Mori ............................. | 324/318 |
| 5,682,098 | 10/1997 | Vij ................................. | 324/318 |

*Primary Examiner*—Louis Arana
*Attorney, Agent, or Firm*—Hill & Simpson

[57] ABSTRACT

An antenna for an NMR device has a first antenna conductor structure which has two opposite end regions at which an electrical connections are respectively arranged. The antenna conductor structure has two conductor loops of equal size which are arranged essentially adjacently on one surface and which are serially connected with opposite polarity at a junction. The connections are respectively arranged at each conductor loop symmetrically to the junction.

9 Claims, 1 Drawing Sheet

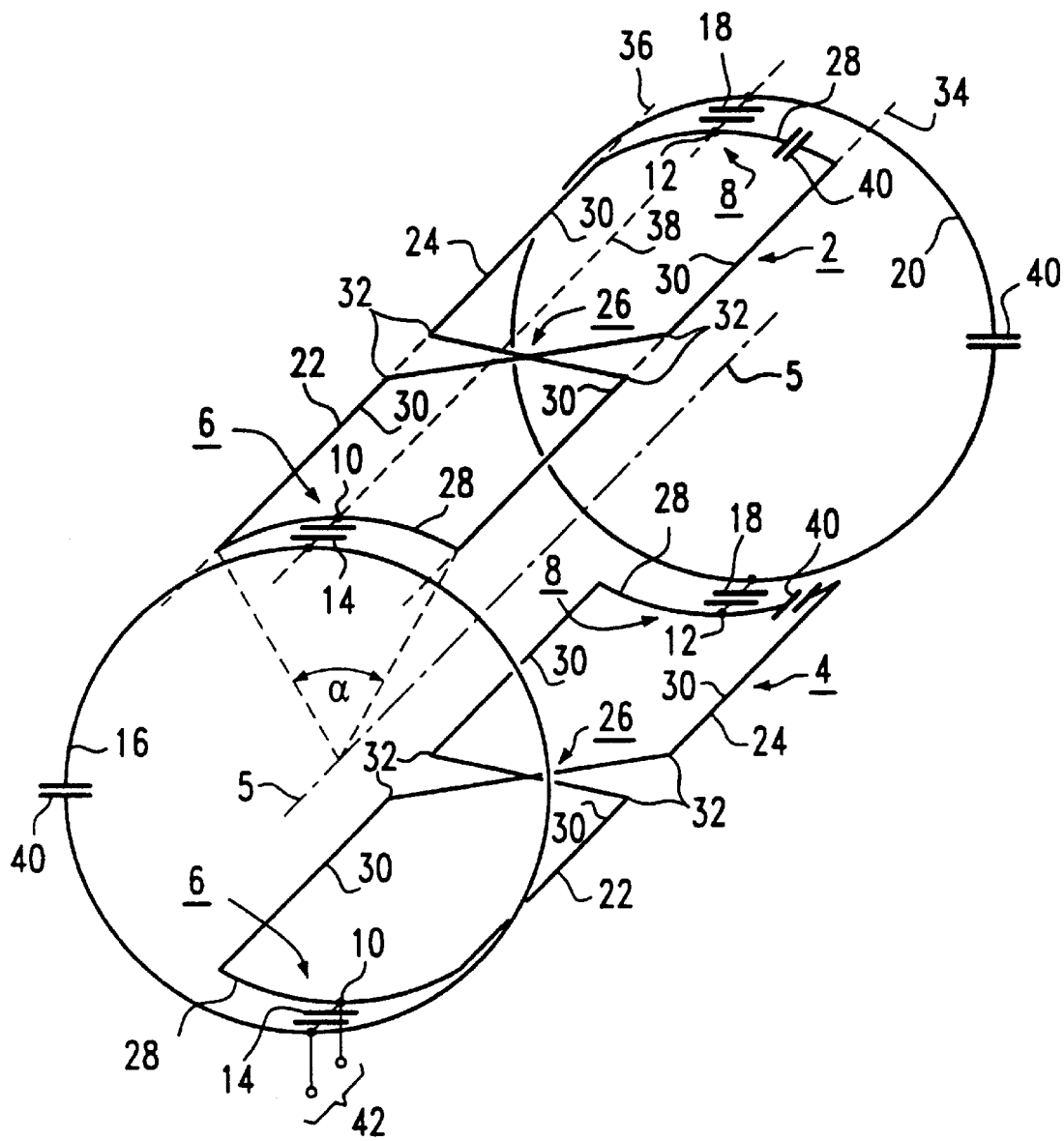

ANTENNA FOR A MAGNETIC RESONANCE DEVICE

BACKGROUND OF THE INVENTION

1. Field of the Invention

The present invention relates to an antenna for a magnetic resonance device of the type having a first antenna conductor structure with two opposite end regions, with respective electrical connections arranged at these end regions.

2. Description of the Prior Art

U.S. Pat. No. 4,825,163 discloses an antenna of the above type. The antenna has four longitudinal conductors arranged longitudinally on a cylinder cladding surface, these conductors all being connected via annular conductors at the ends. Two opposing longitudinal conductors respectively form a linear system with its own signal terminal. Such an antenna is often utilized exclusively as a reception antenna. The excitation of the nuclear magnetic resonance then occurs by means of a whole-body antenna which has a homogeneous field distribution. The reception antenna is inactive during the transmission process of the whole-body antenna.

U.S. Pat. No. 5,382,903 describes an antenna which has a narrowly limited field of view and thus can emit signals with a low noise level. This antenna has an antenna conductor structure with two conductor loops of equal size which are essentially adjacently arranged on one surface, and the conductor loops are serially connected to a junction with opposite polarity. The signal connection for each connection pair occurs via a capacitor which is inserted in one of the conductor loops. The antenna further has annular conductor loops oriented perpendicularly to the antenna conductor structure, this antenna conductor structure suppressing undesirable signals.

U.S. Pat. No. 5,435,302 teaches a flexible surface antenna having a crossed antenna conductor structure with two adjacently arranged conductor loops connected in series with opposite polarity, as also used in the antenna described in the previously cited U.S. Pat. No. 5,382,903.

If the abovementioned antenna is used as reception antenna only, then visible shadows appear in the NMR tomogram in the region of the band-shaped longitudinal conductors of the antenna.

SUMMARY OF THE INVENTION

An object of the present invention is to provide an antenna for an NMR device which does not create signal attenuation in the region of the longitudinal conductors of the antenna when used purely as a reception antenna.

The object is achieved, in an antenna having an antenna conductor structure with two opposite ends at which respective electrical connections are disposed, the antenna conductor structure further having two conductor loops of equal size arranged essentially adjacently on one surface, these being serially connected at a junction and with opposite polarity, with one of the connections being arranged at each conductor loop symmetrically to the junction. To obtain an optimally homogenous distribution of sensitivity within the imaging volume—optimized in the circumferential direction—known antenna conductor structures have a defined extent or a degree of coverage. Such an enlarged antenna conductor structure, however, screens off the transmission field of the whole-body antenna from the examination volume. By means of the inventive splitting (division) of the antenna conductor structure into two conductor loops connected in series with opposite polarity, chronological changes of largely homogenous magnetic alternating fields—as are created by the whole-body antenna—cannot induce any currents. The exciting magnetic field thus can penetrate through the antenna conductor structure and to the examination volume.

In an embodiment, a second antenna conductor structure, is constructed in the same fashion as the first, is arranged parallel to and across from the first antenna conductor structure. Connections of opposite polarity of the two antenna conductor structures are connected to respective self-contained conductors, wherein the closed conductors include an axis of symmetry of the antenna. The two antenna conductor structures with opposite polarity are connected together, so that signal currents induced in them flow in opposite directions. The antenna has a largely homogenous sensitivity distribution in an imaging volume enclosed between the two antenna conductor structures.

DESCRIPTION OF THE DRAWINGS

The single FIGURE is a schematic, perspective view of an antenna for a magnetic resonance apparatus, constructed and operating in accordance with the principles of the present invention.

DESCRIPTION OF THE PREFERRED EMBODIMENTS

The FIGURE depicts—in perspective view—the basic construction of a volume antenna which can be used as reception antenna in a diagnostic NMR device for examining the head or the extremities.

The antenna has a first antenna conductor structure 2 and a second antenna conductor structure 4, which are arranged on a cylinder cladding surface with opposite polarity in the longitudinal direction. An axis of symmetry of the antenna or cylinder cladding surface is represented by the reference character 5. The first and second antenna conductor structures 2 and 4 are constructed in like fashion. Each conductor structure 2 and 4 has an electrical connection 10 at an end region 6 and an electrical connection 12 at an opposite end region 8. The opposing connections 10 (front of the FIGURE) of the two antenna conductor structures 2 and 4 are connected with a closed conductor 16 via respective capacitor arrangements 14. The closed conductor 16 extends circumferentially on the cylinder cladding surface. The opposite connections 12 (rear of the FIGURE of the two antenna conductor structures 2 and 4 are connected with a second closed conductor 20 via respective capacitor arrangements 18, this latter conductor 20 likewise extending circumferentially on the cylinder cladding surface, like the first self-contained conductor 16.

The antenna conductor structures 2 and 4 each have two equally large conductor loops 22 and 24 which are arranged adjacently on the cylinder cladding surface and which are connected at a junction 26 in series with opposite polarity. The conductor loops each have a base conductor piece 28 and two leg conductor pieces 30 connected therewith, which together form a U-shaped conductor piece. The ends 32 of the leg conductor pieces 30 of the two U-shaped conductor pieces are arranged in opposition and are connected with each other diagonally. The connections 10 and 12 are arranged in the middle of the base conductor pieces 28. The conductor pieces of the conductor loops 22 and 24 are constructed narrow in comparison to the circumferential extent of the antenna conductor structures 2 and 4, which is made clear by the angle α.

The two antenna conductor structures 2 and 4 have an essentially rectangular geometry, which is achieved by arranging the mutually opposing leg conductor pieces 30 of the two conductor loops 22 and 24 along a first line 34 and a second line 36, respectively. The two lines 34 and 36 are arranged parallel and at the same distance with respect to a connection line 38 which connects the two connections 10 and 12 with each other. The base conductor pieces 28 are oriented perpendicularly with reference to the connection line 38.

In both the antenna conductor structures 2 and 4 and 16 and 20, a gap is present in one of the two conductor loops—in this case in the conductor loop 24—this gap being bridged by a capacitor arrangement 40. Likewise, in each closed conductor loop 16 and 20 a capacitor 40 is inserted. The capacitance of the capacitor arrangement 40 is selected such that the antenna conductor structures 2 and 4 have a high resistance for currents in kHz range which are induced by chronologically changing magnetic gradient fields, while the resistance for the antenna signal currents in MHZ range is negligible.

The linear antenna previously described using the FIGURE has a signal terminal 42 which is connected in parallel to the capacitor arrangement 14 of an antenna conductor structure.

The antenna can be expanded into a circular polarizing antenna if two other antenna conductor structures arranged in opposition are arranged (with respect to the axis of symmetry 5) so as to be rotated 90° relative to the first and second antenna conductor structures 2 and 4. The connections arranged at the end regions are likewise connected with the first or second closed conductors 16 or 20 via capacitor arrangements. By virtue of the symmetrical arrangement and the essential sameness of the design of all antenna conductor structures, the two linear subsystems are intrinsically uncoupled from each other.

Although modifications and changes may be suggested by those skilled in the art, it is the intention of the inventor to embody within the patent warranted hereon all changes and modifications as reasonably and properly come within the scope of his contribution to the art.

I claim as my invention:

1. An antenna conductor structure for a magnetic resonance device comprising two oppositely disposed end regions with respective electrical connections at said end regions, and two conductor loops of equal size disposed substantially adjacent to each other and defining a single surface, said two conductor loops being connected in series at a junction, with opposite polarities, and the respective electrical connections at said opposite end regions being disposed symmetrically to said junction at each of said two conductor loops.

2. An antenna conductor structure as claimed in claim 1 wherein each of said two conductor loops comprises a U-shaped conductor piece contained in said surface, each U-shaped conductor piece comprising a base conductor piece and two leg conductor pieces connected to said base conductor piece, each of said leg conductor piece having an end and the respective ends of the leg conductor pieces in each of said loops being disposed opposite each other, with diagonally opposed legs of the respective U-shaped conductor pieces being connected to each other via said junction, and the respective electrical connections being symmetrically disposed at the respective base conductor pieces.

3. An antenna conductor structure as claimed in claim 2 wherein said two leg conductor pieces of each U-shaped conductor piece respectively comprise a first leg conductor piece and second leg conductor piece, the respective first leg conductor pieces of said U-shaped conductor pieces being co-linear along a first line, and the respective second leg conductor pieces of said U-shaped conductor pieces being co-linear along a second line, said first and second lines being parallel and being identically spaced from a third line extending between the respective electrical connections.

4. An antenna conductor structure as claimed in claim 2 wherein the respective base conductor pieces are disposed perpendicularly relative to a line connecting the respective electrical connections.

5. An antenna conductor structure as claimed in claim 1 wherein said two end regions and said two conductor loops comprise a first structure, and said antenna conductor structure further comprising a second structure comprising two further end regions and two further conductor loops constructed and interconnected identically to said two end regions and said to conductor loops of said first structure, said second structure being disposed parallel to and opposite said first structure and said antenna conductor structure further comprising first and second closed conductors respectively disposed at the opposite end regions of the first and second structures, and being electrically connected to the respective electrical connections of said first and second structures.

6. An antenna conductor structure as claimed in claim 5 wherein said first and second closed conductors are connected to the respective electrical connections of said first and second structures via respective capacitors.

7. An antenna conductor structure as claimed in claim 5 wherein at least one of said closed conductors has a gap therein bridged by a capacitor.

8. An antenna conductor structure as claimed in claim 5 wherein at least one of said conductor loops has a gap therein which is bridged by a capacitor.

9. An antenna conductor structure as claimed in claim 5 wherein said first and second structures are disposed on a cylinder cladding surface, and wherein said electrical connections are disposed on said cylinder cladding surface in an axially removable manner, and wherein said closed conductors are axially removable from said cylinder cladding surface and extend along a circumferential direction of said cylinder cladding surface.

* * * * *